United States Patent
Zhong et al.

(10) Patent No.: US 7,163,049 B2
(45) Date of Patent: Jan. 16, 2007

(54) COOLING FIN ASSEMBLY

(75) Inventors: Yong Zhong, Shenzhen (CN); Wan-Lin Xia, Shenzhen (CN); Tao Li, Shenzhen (CN)

(73) Assignees: Fu Zhun Precision Industry (Shenzhen) Co., Ltd. (CN); Foxconn Technology Co., Ltd. (TW)

( * ) Notice: Subject to any disclaimer, the term of this patent is extended or adjusted under 35 U.S.C. 154(b) by 0 days.

(21) Appl. No.: 11/018,290

(22) Filed: Dec. 20, 2004

(65) Prior Publication Data
US 2006/0032610 A1 Feb. 16, 2006

(30) Foreign Application Priority Data
Aug. 10, 2004 (CN) .................... 2004 2 0082907

(51) Int. Cl.
F28F 7/00 (2006.01)
H05K 7/20 (2006.01)
(52) U.S. Cl. .................... 165/80.3; 165/185
(58) Field of Classification Search ........... 165/80.3, 165/185, 78, 79; 361/697, 703, 704, 709, 361/710; 174/16.3
See application file for complete search history.

(56) References Cited

U.S. PATENT DOCUMENTS

| | | | |
|---|---|---|---|
| 5,558,155 A * | 9/1996 | Ito | 165/80.3 |
| 6,474,407 B1 | 11/2002 | Chang et al. | 165/80.3 |
| 6,607,028 B1 * | 8/2003 | Wang et al. | 165/185 |
| 6,639,802 B1 * | 10/2003 | Dong et al. | 361/709 |
| 6,644,386 B1 * | 11/2003 | Hsu | 165/80.3 |
| 6,672,379 B1 * | 1/2004 | Wang et al. | 165/185 |
| 6,754,079 B1 * | 6/2004 | Chang | 361/709 |
| 6,789,609 B1 * | 9/2004 | Tsai et al. | 165/78 |
| 2004/0207984 A1 * | 10/2004 | Huang et al. | 361/703 |

FOREIGN PATENT DOCUMENTS

TW 545878 8/2003

\* cited by examiner

Primary Examiner—Tho Duong
(74) Attorney, Agent, or Firm—Morris Manning & Martin LLP; Tim Tingkang Xia, Esq.

(57) ABSTRACT

A cooling fin assembly (10) includes a plurality of cooling fins (10a) joined together. Each of the cooling fins includes a main body (11a) forming four engaging members (14a) at four corners thereof respectively. Each of the engaging members includes a roll piece (15a) with an elongated hole (16a) defined therein and a connecting piece (17a) with an engaging piece (18a) extending therefrom. In assembly of the cooling fins, the engaging pieces of each of the cooling fins engage in the corresponding holes of the roll pieces of an adjacent cooling fin to thereby fasten and join the cooling fins with one another.

6 Claims, 7 Drawing Sheets

COOLING FIN ASSEMBLY

TECHNICAL FIELD

The present invention relates generally to cooling fin assemblies, and more particularly to a cooling fin assembly suitable for heat sinks used in various chipsets or processors of computers.

BACKGROUND

It is widely acknowledged that heat is produced during operations of electronic devices such as chipsets or processors of computers. The faster the operation speed is, the larger the amount of heat produced is, and the higher the temperature of the electronic device becomes. However, excessive high temperature of the electronic device is likely to affect operations thereof and even results in computer crashes. Therefore, heat dissipation devices such as heat sinks are needed for heat dissipation of these electronic devices.

FIG. 7 shows a conventional heat sink 100 used for heat dissipation of electronic devices such as chipsets or processors of computers. The heat sink 100 includes a heat sink base 300 and a cooling fin assembly mounted on the base 300. The cooling fin assembly has a plurality of cooling fins 200 stacked with one another along the longitudinal direction of the base 300. Each of the fins 200 includes a main body 202 and two flanges 204 extending perpendicularly from respective top and bottom edges of the body 202. Each fin 200 provides recess portions 206 and corresponding protrusion portions 208 at the flanges 204 thereof The fins 200 are joined together by the protrusion portions 208 of one fin engaging with the corresponding recess portions 206 of an adjacent fin. However, such conventional positioning mechanism provides poor combination. The fins are prone to drop off from one another due to bump or collision.

SUMMARY OF THE INVENTION

Accordingly, an object of the present invention is to provide a cooling fin assembly having a plurality of fins fastened and joined together with secure combination.

In order to achieve the object set out above, a cooling fin assembly in accordance with the present invention comprises a plurality of cooling fins stacked between a frontmost cooling fin and a rearmost cooling fin. Each of the plurality of cooling fins comprises a main body with a plurality of engaging members formed thereon. Each of the engaging members comprises a roll piece with a hole defined therein and a connecting piece with an engaging piece extending therefrom. In assembly of the cooling fins, the engaging pieces of each of the cooling fins engage in corresponding holes of the roll pieces of an adjacent cooling fin, thereby fastening and joining the cooling fins with one another.

Other objects, advantages and novel features of the present invention will become more apparent from the following detailed description when taken in conjunction with the accompanying drawings, in which:

DETAILED DESCRIPTION OF PREFERRED EMBODIMENTS

Figure 1:
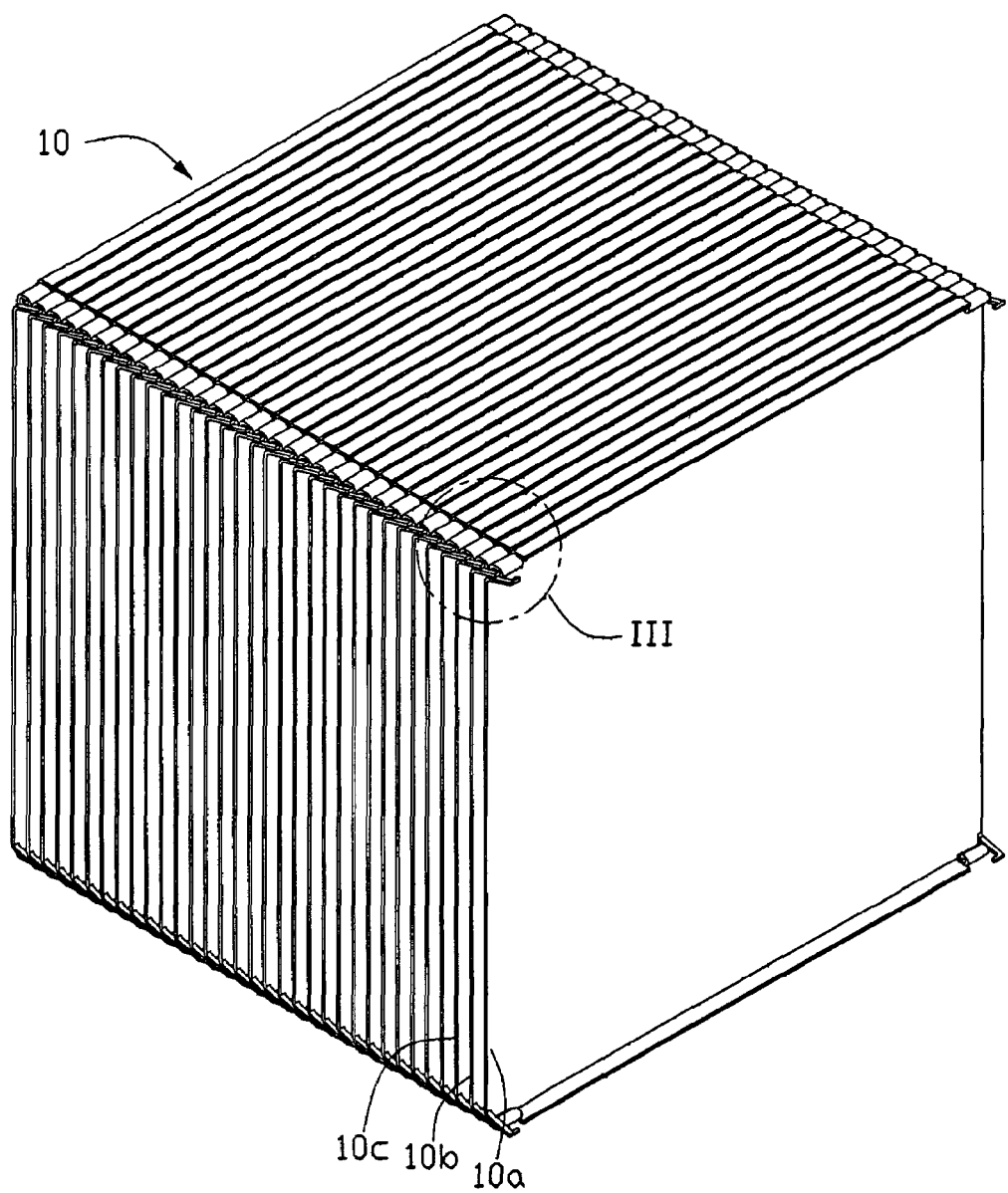
FIG. 1 is an isometric view illustrating a cooling fin assembly according to a preferred embodiment of the present invention.

Reference will now be made to the drawing figures to describe the present invention in detail.

FIG. 1 illustrates a cooling fin assembly 10 according to a preferred embodiment of the present invention. The cooling fin assembly 10 comprises a plurality of cooling fins 10a, 10b, 10c, and so on, joined with one another. The cooling fin assembly 10 is suitable for heat sinks used in various chipsets or processors of computers for heat dissipation.

Figure 2:
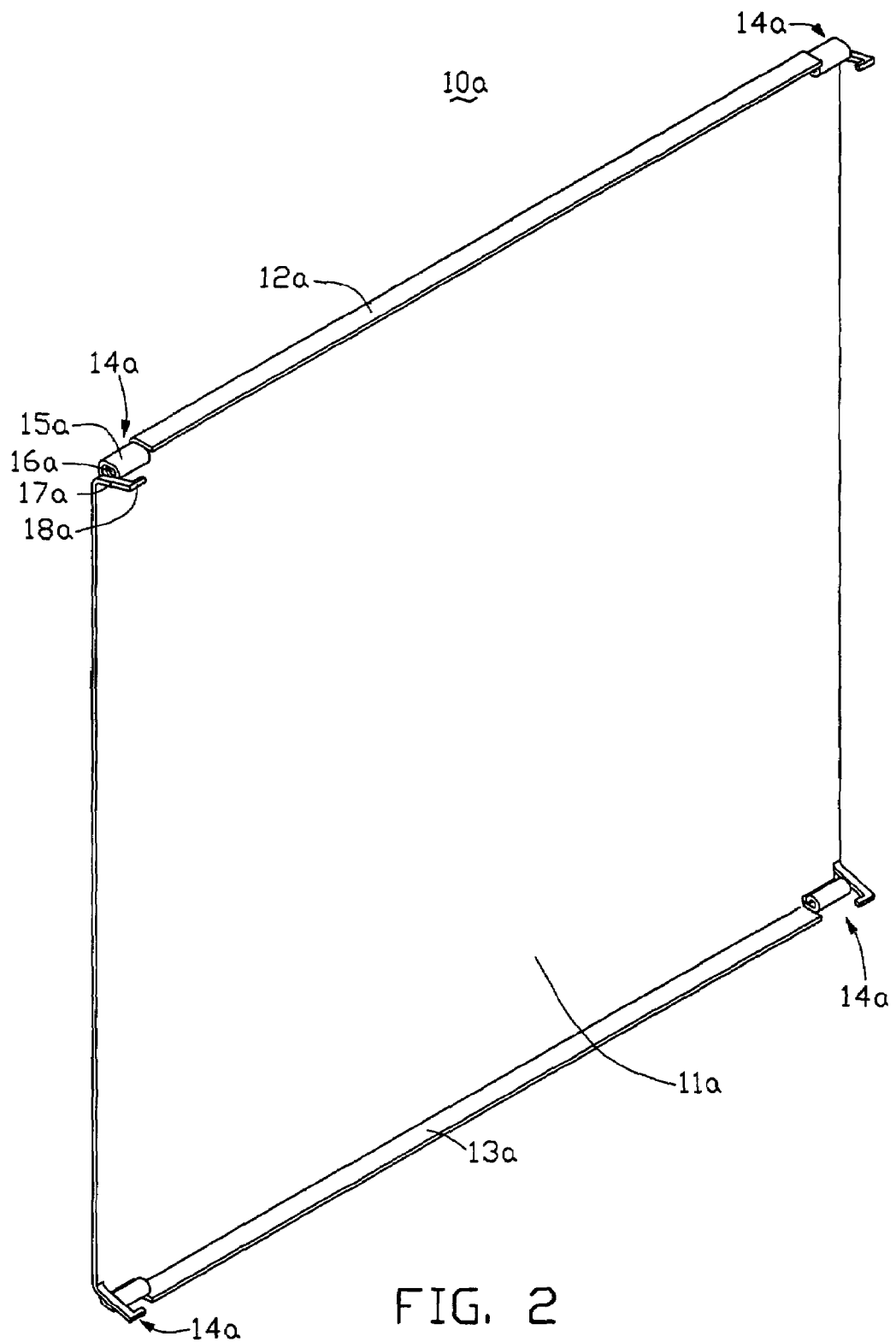
FIG. 2 is an isometric view showing one fin of the cooling fin assembly of FIG. 1.

The cooling fins 10a, 10b, 10c, and so on, are identical. Accordingly, a description of the cooling fin 10a serves as a description for all of them. Referring to FIG. 2, the cooling fin 10a includes a main body 11a with four corners thereof forming four engaging members 14a respectively. Each of the engaging members 14a comprises a roll piece 15a as a first engaging portion, a connecting piece 17a as a second engaging portion and an engaging piece 18a. The roll piece 15a and the connecting piece 17a are located at the same side of the body 11a. The connecting piece 17a extends aslant and integrally from a side edge of the body 11a. The engaging piece 18a extends perpendicularly and inwardly from a free end of the connecting piece 17a and is parallel to the body 11a. The roll piece 15a locates inside of and adjacent to the connecting piece 17a and is integrally formed by folding a single plate from the body 11a with an elongated hole 16a defined therein. The hole 16a is parallel to the body 11a. An upper flange 12a and a lower flange 13a extend perpendicularly from the upper edge and the lower edge of the body 11a respectively, between two adjacent engaging members 14a.

Figure 3:
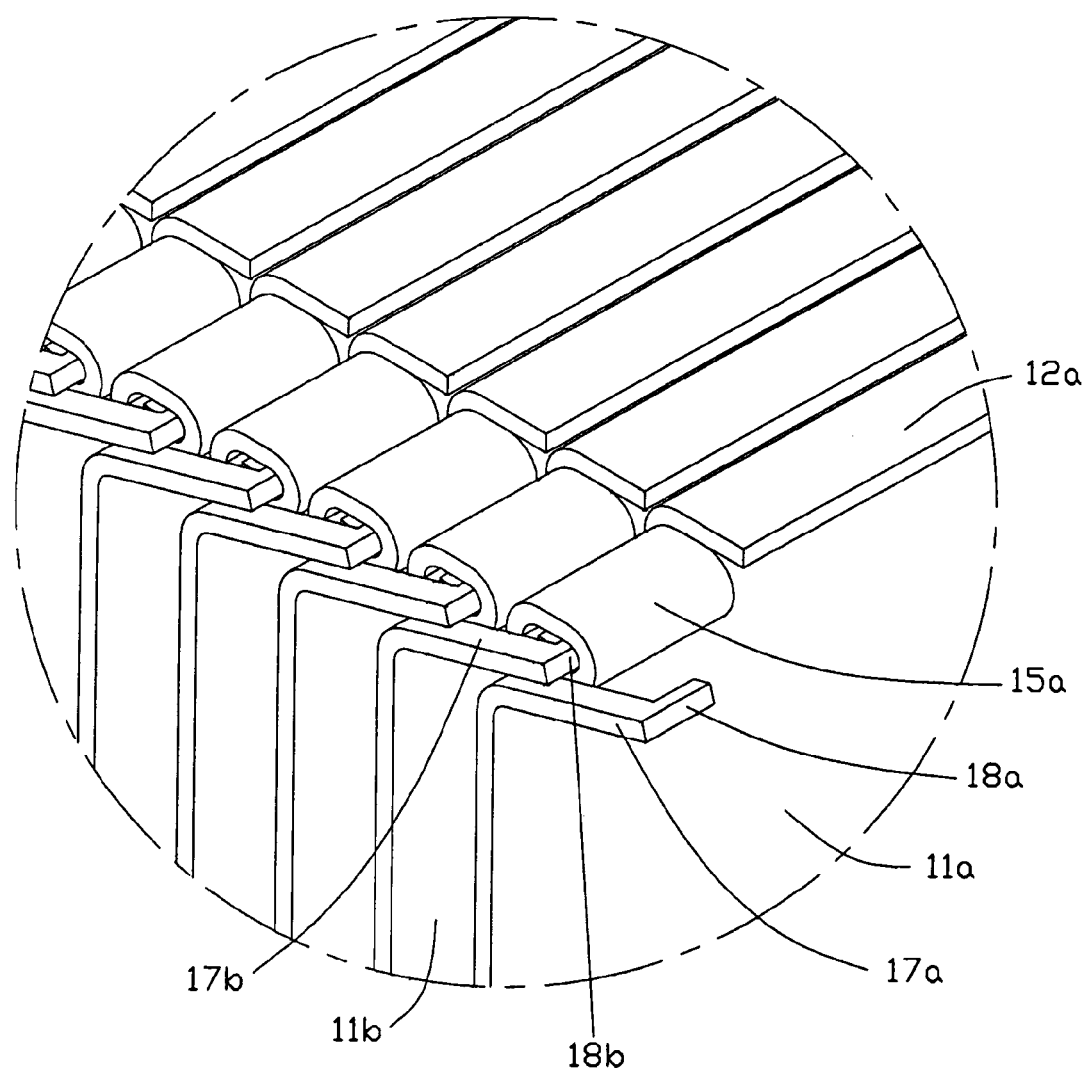
FIG. 3 is an enlarged view showing a portion indicated as III of the cooling fin assembly in FIG 1.

Referring also to FIG. 3, in assembly, the first cooling fin 10a is held in a vertical position, and the second cooling fin 10b is placed parallel to and against a rear face of the first cooling fin 10a. At this stage, an external force is needed, such as a force exerted by fingers of a hand, to expand the connecting pieces 17b of the second cooling fin 10b outwardly to cause the engaging pieces 18b thereof exactly facing the corresponding holes 16a of the roll pieces 15a of the first cooling fin 10a. Then, removing the external force, the connecting pieces 17b of the second cooling fin 10b restores to their original positions and the engaging pieces 18b thereof therefore engage in the corresponding holes 16a of the first cooling fin 10a. The first and second cooling fins 10a, 10b are thus interlocked and fastened together. Other fins 10c, and so on, are then sequentially interlocked with one another in the same way as the above-mentioned procedures. The combined cooling fin assembly is then attached to a heat sink base (now shown) to form a heat sink used for heat dissipation of electronic devices.

Figure 4:
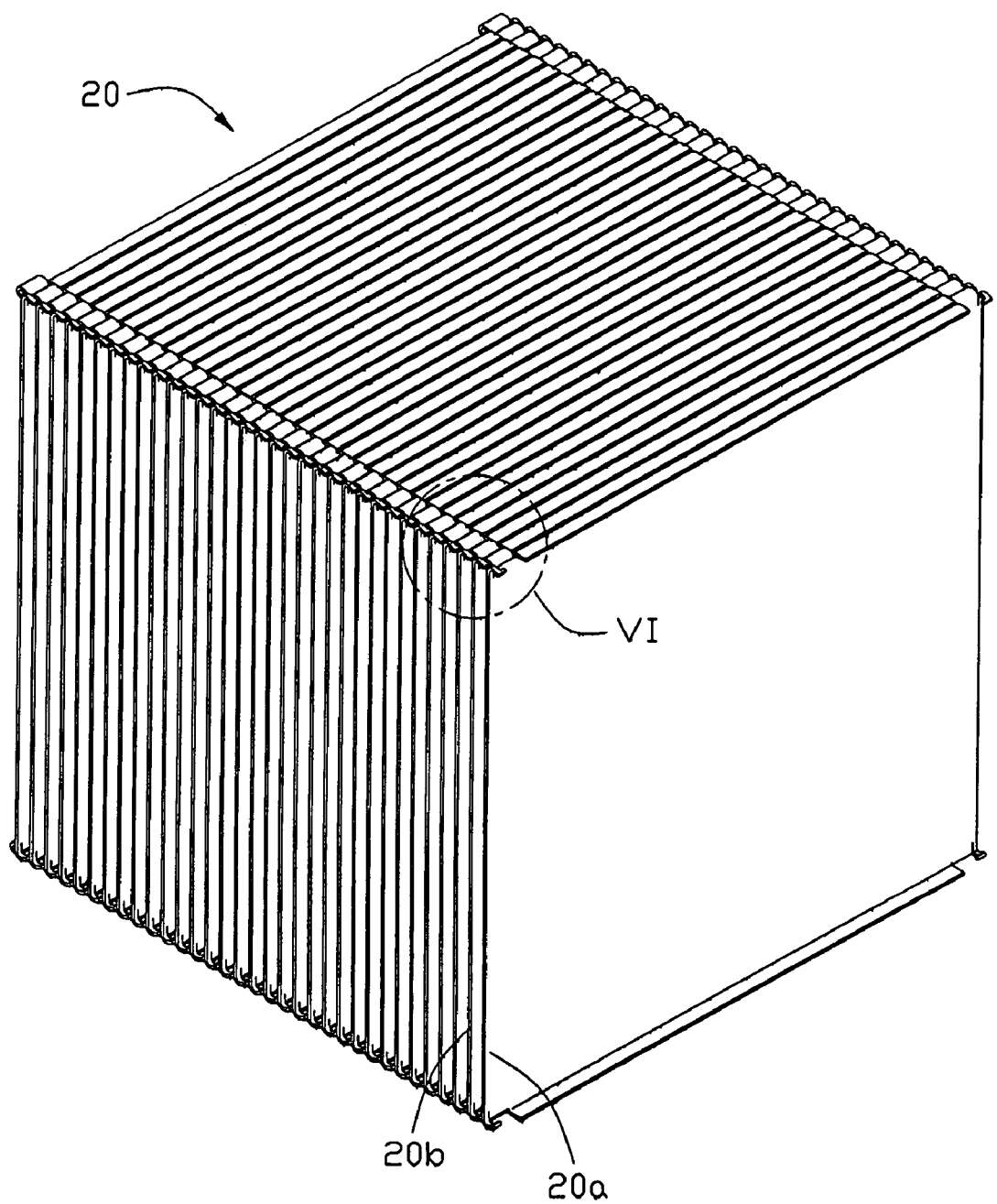
FIG. 4 is an isometric view illustrating a cooling fin assembly according to an alternative embodiment of the present invention.
Figure 5:
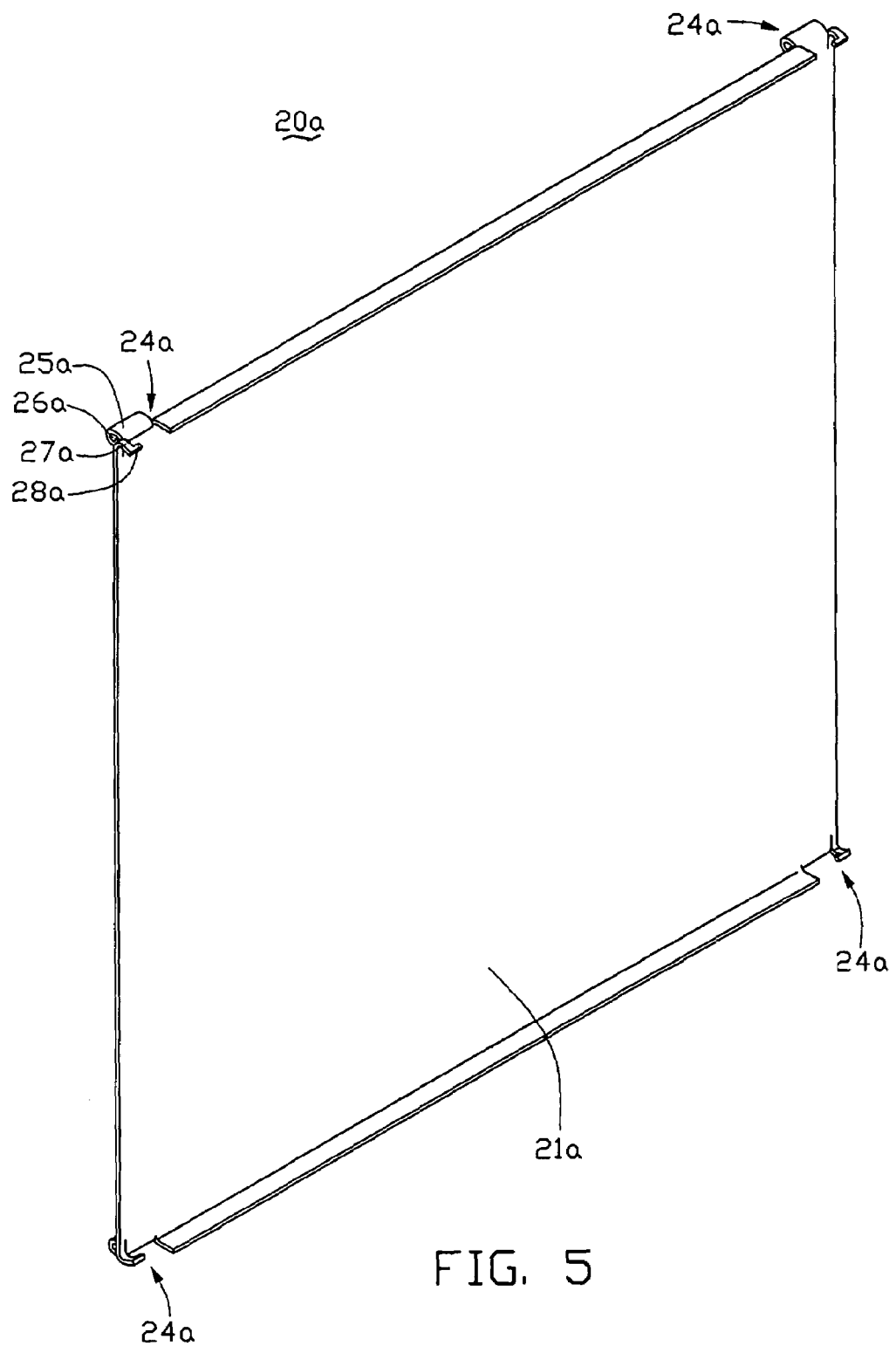
FIG. 5 is an isometric view showing one fin of the cooling fin assembly of FIG 4.
Figure 6:
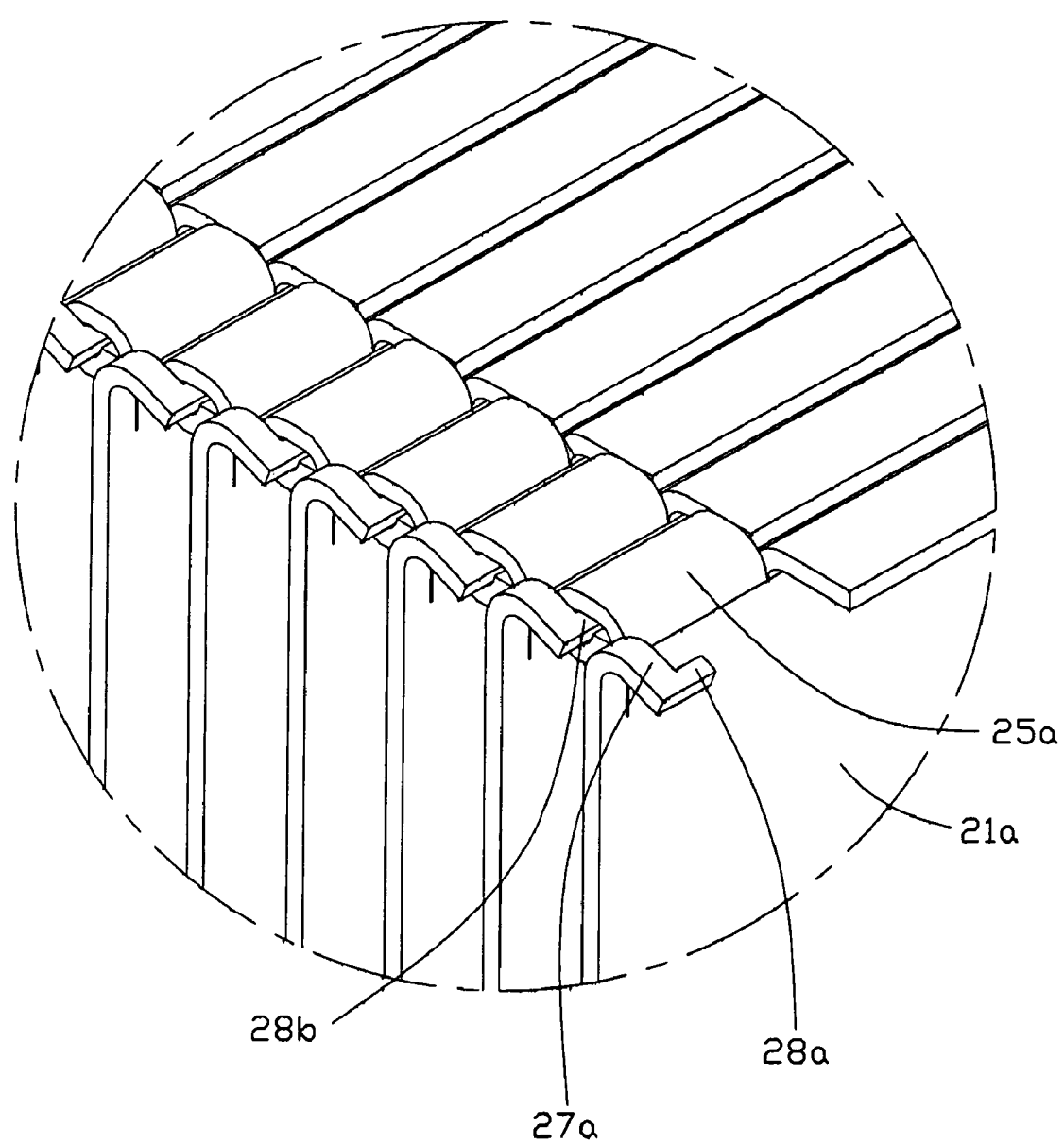
FIG. 6 is an enlarged view showing a portion indicated as VI of the cooling fin assembly in FIG. 4.
Figure 7:
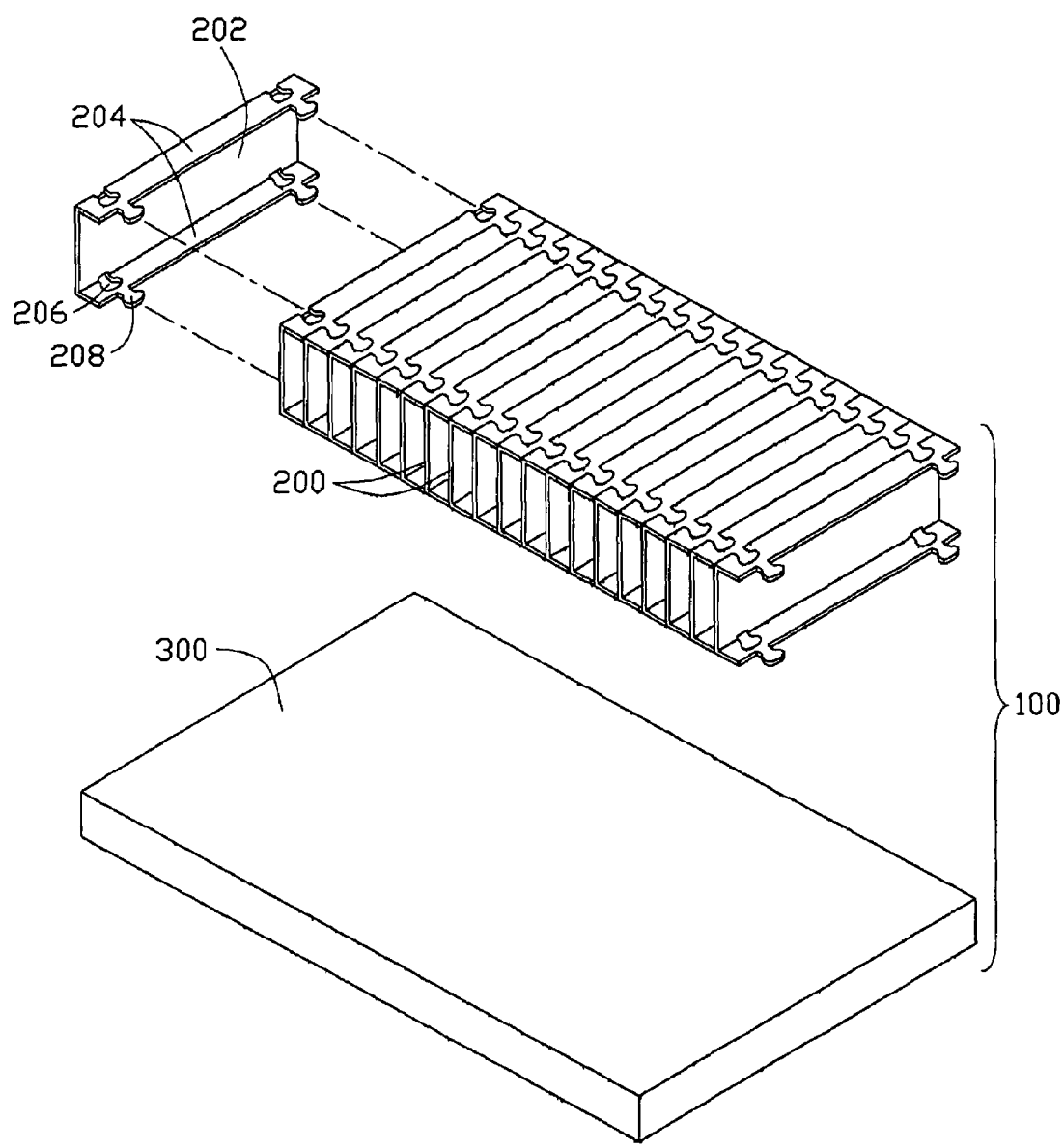
FIG. 7 is an isometric view showing a conventional heat sink.

FIG. 4 to FIG. 6 illustrate a cooling fin assembly 20 according to an alternative embodiment of the present invention. The cooling fin assembly 20 which includes a plurality of interlocked cooling fins 20a, 20b, and so on, is similar to the above-mentioned cooling fin assembly 10. The cooling fin 20*a* includes a main body 21*a* with four corners thereof forming four engaging members 24*a* respectively Each engaging member 24*a* includes a roll piece 25*a* with an elongated hole 26*a* defined therein and a connecting piece 27*a* with an engaging piece 28*a* extending therefrom. The connecting piece 27*a* and the roll piece 25*a* are located at opposite sides of the body 21*a* In assembly, the holes 26*a* of the roll pieces 25*a* of the first cooling fin 20*a* receives the corresponding engaging pieces 28*b* of the second cooling fin 20*b* by using the above-mentioned assembling procedures.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cooling fin assembly comprising:
   a plurality of fins connected together, each of the fins comprising a main body, a flange extending from an edge of the main body, a roll piece extending from the main body and located beside the flange and a connecting piece extending from the main body and located beside the roll piece, the roll piece being located between the flange and the connecting piece, the connecting piece including an engaging piece inserted into the roll piece of a neighboring fin thereby to connect the fins together.

2. The cooling fin assembly of claim 1, wherein the engaging piece is enclosed byte roll piece of the neighboring fin.

3. The cooling fin assembly of claim 2, wherein the connecting piece extends from a side edge of the main body of the each of the fins.

4. The cooling fin assembly of claim 3, wherein the connecting piece extends aslant from the side edge of the main body of the each of the fins.

5. The cooling fin assembly of claim 1, wherein the connecting piece extends from a side edge of the main body of the each of the fins.

6. The cooling fin assembly of claim 5, wherein the connecting piece extends aslant from the side edge of the main body of the each of the fins.

* * * * *